(12) United States Patent
Abraham

(10) Patent No.: US 7,227,959 B2
(45) Date of Patent: Jun. 5, 2007

(54) MULTI-CHANNEL DIGITAL FEEDBACK REDUCER SYSTEM

(75) Inventor: Mathew T. Abraham, Chicago, IL (US)

(73) Assignee: Shure Incorporated, Evanston, IL (US)

( * ) Notice: Subject to any disclaimer, the term of this patent is extended or adjusted under 35 U.S.C. 154(b) by 0 days.

(21) Appl. No.: 10/786,697

(22) Filed: Feb. 25, 2004

(65) Prior Publication Data
US 2004/0179387 A1 Sep. 16, 2004

Related U.S. Application Data

(60) Provisional application No. 60/453,318, filed on Mar. 10, 2003.

(51) Int. Cl.
H04R 27/00 (2006.01)
H04B 15/00 (2006.01)

(52) U.S. Cl. .................. 381/83; 381/93; 381/94.3

(58) Field of Classification Search ........ 327/551–553, 327/556; 330/109, 284, 294; 333/18; 381/57, 381/103, 104, 318, 83, 93
See application file for complete search history.

(56) References Cited

U.S. PATENT DOCUMENTS

| 4,088,834 | A | * | 5/1978 | Thurmond | 381/83 |
|---|---|---|---|---|---|
| 4,091,236 | A | | 5/1978 | Chen | |
| 4,177,356 | A | * | 12/1979 | Jaeger et al. | 381/103 |
| 5,119,428 | A | * | 6/1992 | Prinssen | 381/63 |
| 5,142,586 | A | * | 8/1992 | Berkhout | 381/63 |
| 5,245,665 | A | * | 9/1993 | Lewis et al. | 381/93 |
| 5,506,910 | A | * | 4/1996 | Miller et al. | 381/103 |
| 5,937,070 | A | * | 8/1999 | Todter et al. | 381/71.6 |
| 6,381,272 | B1 | * | 4/2002 | Ali | 375/233 |

* cited by examiner

Primary Examiner—Sinh Tran
Assistant Examiner—Daniel R. Sellers
(74) Attorney, Agent, or Firm—Banner & Witcoff, Ltd.

(57) ABSTRACT

The present invention provides method and apparatus that improve processing of acoustic signals by reducing acoustic feedback in an acoustic system. An aspect of the invention is a multi-channel digital feedback reducer (DFR) system that comprises a plurality of channel elements. Each channel element comprises a notch filter configuration having an adaptive notch filter and an operative notch filter. The operative notch filter processes a signal received from an acoustic input device and provides the processed signal to an acoustic output device, in which acoustic feedback between the acoustic input device and the acoustic output device is ameliorated. If acoustic feedback is detected by a channel element, the channel element informs other channel elements of the multi-channel DFR system about the detected feedback to ensure that all channel elements may incorporate the same notch filters. During the notification, the other channel elements may continue searching for feedback on the associated channels.

27 Claims, 10 Drawing Sheets

| | | EXEMPLARY EVENT SCENARIO | | |
|---|---|---|---|---|
| | TIME DURATION | EVENT | LEFT DFR | RIGHT DFR |
| 301 | 1 | | DETECTOR RUNNING | DETECTOR RUNNING |
| 303 | 2 | FEEDBACK DETECTED ON RIGHT CHANNEL | DETECTOR RUNNING | SEND SEMAPHORE |
| 305 | 3 | | RECEIVE SEMAPHORE | EITHER DEEPEN EXISTING NOTCH OR CREATE NEW FILTER |
| 307 | 4 | | DETECTOR RUNNING | RAMP NOTCH FILTER |
| 309 | 5 | FEEDBACK DETECTED ON LEFT CHANNEL | SEND SEMAPHORE | CONTINUE RAMPING FILTER |
| 311 | 6 | | WAIT | SEND FILTER PARAMETERS |
| 313 | 7 | | CONFIGURE NOTCH FILTER ACCORDING TO RECEIVED PARAMETERS | DETECTOR RUNNING |
| 315 | 8 | | DEPLOY NOTCH FILTER | DETECTOR RUNNING |
| 317 | 9 | | SEND FILTER PARAMETERS | DETECTOR RUNNING |
| 319 | 10 | | | CONFIGURE NOTCH FILTER ACCORDING TO RECEIVED PARAMETERS |
| 321 | 11 | | DETECTOR RUNNING | DETECTOR RUNNING |

| EXEMPLARY PERFORMANCE DATA OF A DUAL-CHANNEL DFR | | | | | | |
|---|---|---|---|---|---|---|
| | Trial 1 | | Trial 2 | | Trial 3 | |
| Freq. | Single CH | Dual CH | Single CH | Dual CH | Single CH | Dual CH |
| 100 | 2.313 | 1.816 | 2.866 | 1.862 | 3.197 | 3.022 |
| 200 | 3.050 | 2.292 | 2.826 | 1.813 | 3.019 | 2.067 |
| 400 | 2.018 | 1.602 | 1.795 | 1.361 | 1.911 | 1.279 |
| 800 | 1.757 | 1.259 | 1.716 | 1.359 | 1.710 | 1.215 |
| 1600 | 1.785 | 1.215 | 1.610 | 1.358 | 1.727 | 1.349 |
| 3200 | 1.757 | 1.359 | 1.661 | 1.299 | 1.661 | 1.334 |
| 6400 | 1.713 | 1.223 | 1.566 | 1.260 | 1.656 | 1.158 |
| 12800 | 1.627 | 1.332 | 1.682 | 1.308 | 1.634 | 1.309 |
| AVERAGE | 2.003 | 1.512 | 1.965 | 1.453 | 2.064 | 1.592 |
| AVERAGE (SINGLE CH): 2.011 seconds | | | | | | |
| AVERAGE (DUAL CH):   1.519 seconds | | | | | | |

1000

FIG. 10

MULTI-CHANNEL DIGITAL FEEDBACK REDUCER SYSTEM

This application claims priority to provisional U.S. Application. No. 60/453,318, filed Mar. 10, 2003.

FIELD OF THE INVENTION

The invention relates to techniques for reducing acoustic feedback, and more particularly relates to such techniques in which a digital notch filter algorithm is employed for a plurality of acoustic channels.

BACKGROUND OF THE INVENTION

Notch filters are often used to reduce acoustic feedback in sound amplification systems, including public address systems and music delivery systems in which microphones and speakers are deployed. For example, U.S. Pat. No. 4,091,236 (Chen, issued May 23, 1978) describes an analog notch filter for an audio signal to suppress acoustic feedback. The apparatus receives an audio signal that is substantially non-periodic in the absence of acoustic feedback and substantially periodic with an instantaneous dominant frequency in the presence of such feedback.

The duration of successive periods are monitored and compared by an up/down counter to determine whether the audio input signal is substantially periodic and to determine the instantaneous dominant frequency of the audio signal. Upon detection of an audio signal that is substantially periodic, the notch filter is tuned to the instantaneous dominant frequency so as to suppress the acoustic feedback.

U.S. Pat. No. 4,232,192 (Beex, issued Nov. 4, 1980) describes an integrator/detector that determines when an audio signal has exceeded a threshold for a selected number of cycles. If the threshold is exceeded for the selected number of cycles, a sampler circuit samples a voltage corresponding to the frequency that has exceeded the threshold. The sampled voltage is used by a voltage frequency converter in order to adjust the notch of a notch filter implemented in hardware.

U.S. Pat. No. 5,245,665 (Lewis et al., issued Sep. 14, 1993) describes a device for suppressing feedback in which a Fast Fourier Transform is conducted on samples of digitized signals to produce corresponding frequency spectrums. The magnitudes of the spectrum at various frequencies are analyzed to determine one or more peak frequencies that are 33 decibels greater than harmonics or sub-harmonics of the frequency in an attempt to detect resonating feedback frequencies. Two processors are required. A primary processor periodically collects a series of the passing digital signals and conducts a Fast Fourier Transform on each collected series of digital signals. The frequency spectrums produced by the Fast Fourier Transform are examined by the primary processor to discover the presence of any resonating feedback frequency. Filter control signals are passed by the primary processor, along with the digital sound signals, to a secondary processor which operates a digital filtering algorithm in accordance with the filter control signals to attenuate resonating feedback frequencies in the stream of digital signals.

U.S. Pat. No. 5,999,631 (Porayath, et al., issued Dec. 7, 1999) employs an algorithm defining a digital filter with a notch adjustable to a plurality of notch values for a single acoustic channel. Feedback is located by comparing values resulting from the processing with the notch adjusted to different notch values. Notch filter coefficients are generated directly by the feedback detector, in which feedback is detected if a first harmonic component is sufficiently small relative to a fundamental component. The notch values are adjusted until the signals processed by the notch filter algorithm result in a minimum mean squared value over a time window. After the feedback has been located using the notch filter algorithm, digital output signals are generated by executing the algorithm with the notch adjusted to the notch value at which the minimum mean squared value results. The digital output signals then are converted to corresponding analog signals that are transmitted to a speaker.

The approaches of the prior art, as described heretofore, reduce acoustic feedback on an individual channel basis. However, public address systems and music delivery systems may utilize a plurality of channels, such as a stereophonic (2-channel) acoustic system. A listener is typically very sensitive to any differences of operation between channels (often referred as "stereo image"), even though the differences may seem insignificant in an absolute sense. Furthermore, a notch filter may be deployed on one channel and not the other. Such an occurrence would cause a higher degradation of the stereo image. Thus, it would be an advancement of the art to provide apparatuses and methods that assist in balancing a plurality of acoustic channels for an acoustic delivery system.

BRIEF SUMMARY OF THE INVENTION

The present invention improves processing of acoustic signals by reducing acoustic feedback in an acoustic system, including a public address system, hearing aid, teleconferencing system, hands-free communication interface, and music delivery system. An aspect of the invention is a multi-channel digital feedback reducer (DFR) system that comprises a plurality of channel elements. In an embodiment of the invention, each channel element comprises a notch filter configuration having an adaptive notch filter and an operative notch filter. The operative notch filter processes a signal received from an acoustic input device (e.g. a microphone) and provides the processed signal to an acoustic output device (e.g. a speaker), in which acoustic feedback between the acoustic input device and the acoustic output device is ameliorated. If acoustic feedback is detected by a channel element, the channel element informs other channel elements of the multi-channel DFR system about the detected feedback. In such a case, the other channel elements may continue searching for feedback on the associated channels and configure the associated operative notch filters once filter parameters are sent by the channel element to the other channel elements. Experimental data indicates that a multi-channel DFR system having intra-system communication operates faster than a DFR configuration in which each channel element operates in an independent and isolated fashion.

An exemplary embodiment of the invention is provided for a stereophonic DFR system. The stereophonic DFR system comprises a right channel and a left channel. Each channel element has an associated operative notch filter that can be configured for a plurality of notches having different notch depths and notch frequencies. In the exemplary embodiment, if a channel element (left channel element or right channel element) detects an acoustic feedback component on the associated channel, the channel element ameliorates the associated feedback component. Additionally, that channel element informs the other channel element through a communications pathway. The other channel element may continue to detect acoustic feedback on its channel while waiting for filter information.

BRIEF DESCRIPTION OF THE DRAWINGS

A more complete understanding of the present invention and the advantages thereof may be acquired by referring to the following description in consideration of the accompanying drawings, in which like reference numbers indicate like features and wherein:

FIG. 3 shows an event scenario for a dual-channel digital feedback reducer system in accordance with an embodiment of the invention;

FIG. 10 shows exemplary performance data of a dual-channel digital feedback reducer.

DETAILED DESCRIPTION OF THE INVENTION

Figure 1:
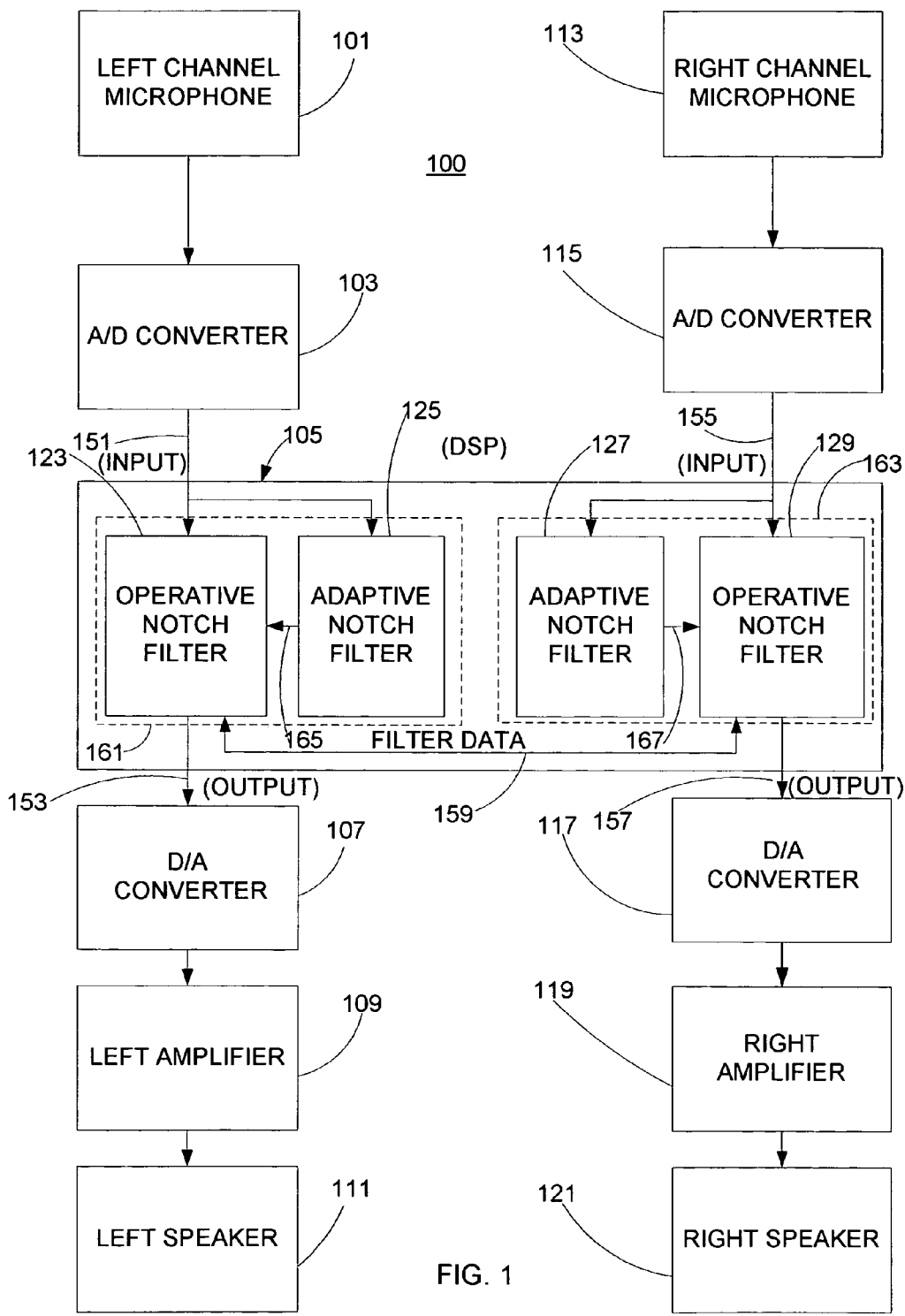
FIG. 1 is an architectural diagram of a dual-channel digital feedback reducer system (DFR) in accordance with an embodiment of the invention.

FIG. 1 is an architectural diagram of a dual-channel digital feedback reducer system (DFR) system 100 in accordance with an embodiment of the invention. DFR 100 is a stereophonic system, supporting a left channel and a right channel. The left channel comprises a left channel microphone 101, and analog to digital (A/D) converter 103, a digital to analog (D/A) converter 107, a left amplifier 109, and a left speaker. The right channel comprises a right channel microphone 113, and an analog to digital (A/D) converter 115, a digital to analog converter (D/A) 117, a right amplifier 119, and a right speaker. Additionally a processor 105 processes signals from the left channel and the right channel (from A/D converter 103 and A/D converter 115, respectively) and provides the processed signals to D/A converter 107 and D/A converter 117, respectively.

Processor 105 processes the left channel (corresponding to an input 151 and an output 153) with an operative notch filter 123 and the right channel (corresponding to an input 155 and an output 157) with an operative notch filter 127. (A functional architecture for operative notch filters 123 and 127 is discussed in the context of FIG. 9, although other filter topologies may be utilized in other embodiments of the invention.) Operative notch filter 123 is configured by an adaptive notch filter 125 through a control path 165 and operative notch filter 129 is configured by an adaptive filter 127 through a control path 167. (A topology for adaptive notch filters 125 and 127 is discussed in the context of FIG. 8, although other topologies may be used in other embodiments of the invention.) Operative notch filter 123 or operative notch filter 129 notifies the other operative filter through communications path 159 whenever the associated adaptive filter determines the occurrence of acoustic feedback between an acoustic output device (e.g. a speaker) and an acoustic input device (e.g. a microphone) of DFR system 100 as is discussed with FIG. 2. (Acoustic feedback is typically characterized by a signal having a fundamental component with small harmonic components.) Operative notch filter 123 and adaptive notch filter 125 is collectively referred as a left DFR 161, and operative notch filter 129 and adaptive notch filter 127 is collectively referred as a right DFR 163.

Figure 2:
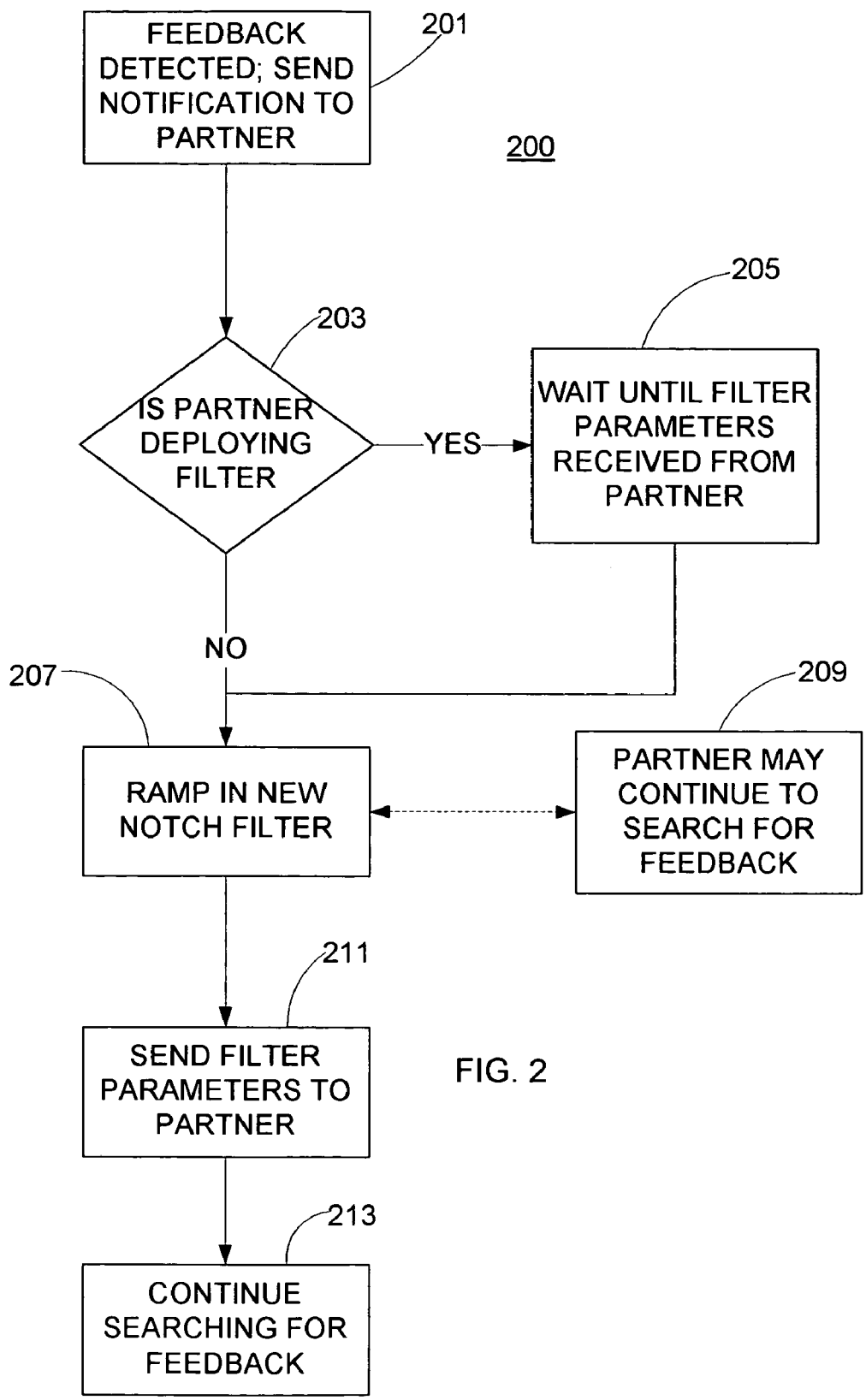
FIG. 2 is a flow diagram illustrating an operation of a dual-channel digital feedback reducer in accordance with an embodiment of the invention.

FIG. 2 is a flow diagram illustrating an operation of dual-channel digital feedback reducer system 100 as shown in FIG. 1 in accordance with an embodiment of the invention. In order to clarify operation of DFR system 100, the discussion presents a perspective of the left channel, corresponding to adaptive notch filter 125 and operative notch filter 123. The "partner" corresponds to adaptive notch filter 127 and operative notch filter 129 (that is associated with the right channel). However, the discussion is similar from the perspective of the right channel.

Whenever adaptive notch filter 125 detects acoustic feedback in step 201 and if the other adaptive notch filter 127 is not deploying (i.e. configuring) its operative notch filter 129 (as determined in step 203), adaptive notch filter 125 will configure its operative notch filter 123 by ramping an existing or a new notch for operative notch filter 123 in step 207. Additionally, operative notch filter 123 notifies operative notch filter 129 (its "partner") that acoustic feedback has been detected as shown in step 201. In such a case, adaptive notch filter 127 may continue search for acoustic feedback on the right channel as shown in step 209. However, in such a case, adaptive notch filter 127 does not configure operative notch filter 129 until adaptive notch filter 125 has completed deploying operative notch 123 and operative notch filter 123 has sent the corresponding filter parameters to operative notch filter 129. In the embodiment, operative notch filters 123 and 129 can operate with 16 notch filters, where the number of notch filters is configurable and where each notch filter corresponds to a notch frequency and a notch depth varying from 0 dB and 18 dB. Notch depths for different notch frequencies may differ in magnitude. However, variations of the embodiment may utilize a different number of notch filters.

However, in step 203, if adaptive notch filter 127 is configuring (deploying) operative notch filter 129 and if adaptive notch filter 125 detects acoustic feedback on the left channel, adaptive notch filter 125 will defer configuring operative notch filter 123 in accordance with detecting acoustic feedback on the left channel. Rather, in step 205, operative notch filter 123 will wait for receiving filter parameters from operative notch filter 129 (its "partner") and adaptive notch filter 125 will continue searching for feedback detection on the left channel. When operative notch filter 123 receives the filter parameters, operative notch filter 123 is configured in accordance with the received filter parameters.

Although the embodiment shown in FIG. 2 utilizes a digital signal processor (i.e. DSP 105), other embodiments of the invention may utilize other types of components such as discrete components (e.g. operational amplifiers) and customized integrated circuits.

FIG. 3 shows an event scenario 300 for dual-channel digital feedback reducer system 100 in accordance with an embodiment of the invention. Event scenario 300 is one possible scenario that is supported by the embodiment and includes entries 301-321, where each entry comprises a time duration 323, an event 325, a corresponding action 327 that is executed by left DFR 161, and a corresponding action 329 that is executed by right DFR 163. During time duration of entry 301, both left and right channel DFRs (corresponding to adaptive notch filters 125 and 127, respectively) are searching for acoustic feedback.

With entry 301, both left DFR 161 and right DFR 163 are searching for acoustic feedback (as designated by "detector running"). With entry 303, right DFR 163 detects acoustic feedback on the right channel (corresponding to an event "feedback detected on right channel") and consequently sends a semaphore (flag) over communications path 159 to notify left DFR 161 that acoustic feedback has been detected by DFR 163. Upon receiving the semaphore as shown in entry 305, left DFR 161 continues searching for acoustic feedback on the left channel. If during the time that DFR 161 is waiting for filter parameters (data) from DFR 163, DFR 161 will not deploy (configure) operative notch filter 123 in accordance with parameters determined by adaptive notch filter 125 if DFR 161 detects acoustic feedback on the left channel. Rather, adaptive notch filter 125 will continue searching for acoustic feedback on the left channel and will defer configuring operative notch filter 123 until operative notch filter 129 sends filter data (parameters) to operative notch filter 123 over communications path 159 and operative notch filter 123 is configured according to the sent filter data. With entry 305, operative notch filter 129 either deepens an existing notch or creates a notch at a new frequency. (The operation of operative notch filters 123 and 129 are discussed in the context of FIG. 9.)

With entry 307, operative notch filter 129 ramps the notch. (In the embodiment of the invention, the notch is increased 0.5 dB per 10 msec until the notch is deepened 3 dB, which takes approximately 60 msec. Ramping the notch ameliorates a perceptible degradation by a user of DFR system 100 by gradually inducing the notch. (With a plurality of ramping operations corresponding to detecting acoustic feedback at different times, the notch may be deepened to 18 dB in the embodiment.) In entry 309, left DFR 161 detects acoustic feedback on the left channel and sends a semaphore to right DFR 161 over communications path 159. However, as previously mentioned, adaptive notch filter 125 defers configuring operative notch filter 123 in accordance with the detected acoustic feedback on the left channel.

With entry 311 left DFR 161 waits for filter parameter information from right DFR 163. Right DFR 163 completes ramping the associated notch and sends filter parameters to DFR 161 over communications path 159. In the embodiment, filter parameters comprise a frequency of the notch ($F_i$), a bandwidth of the notch ($BW_i$), and a gain of the notch ($G_i$). The filter parameters are discussed in the context of FIG. 9. With entry 313, operative notch filter 123 is configured according to filter parameters that it receives from operative notch filter 129. With entry 313, right DFR 163 searches for acoustic feedback on the right channel, in which a notch may be subsequently deepened or a notch at another frequency may be created.

With entry 315, left DFR 161 configures operative notch filter 123 in accordance with acoustic feedback that is detected by adaptive filter 125 on the left channel. Right DFR 163 continues searching for acoustic feedback on the right channel. With entry 317, operative notch filter 123 completes its configuration and sends filter parameters to operative notch filter 129. Consequently, with entry 319, operative notch filter 129 is configured in accordance with the received filter parameters. With entry 321, both DFR 161 and DFR 163 continue search for acoustic feedback on respective channels.

Figure 4:
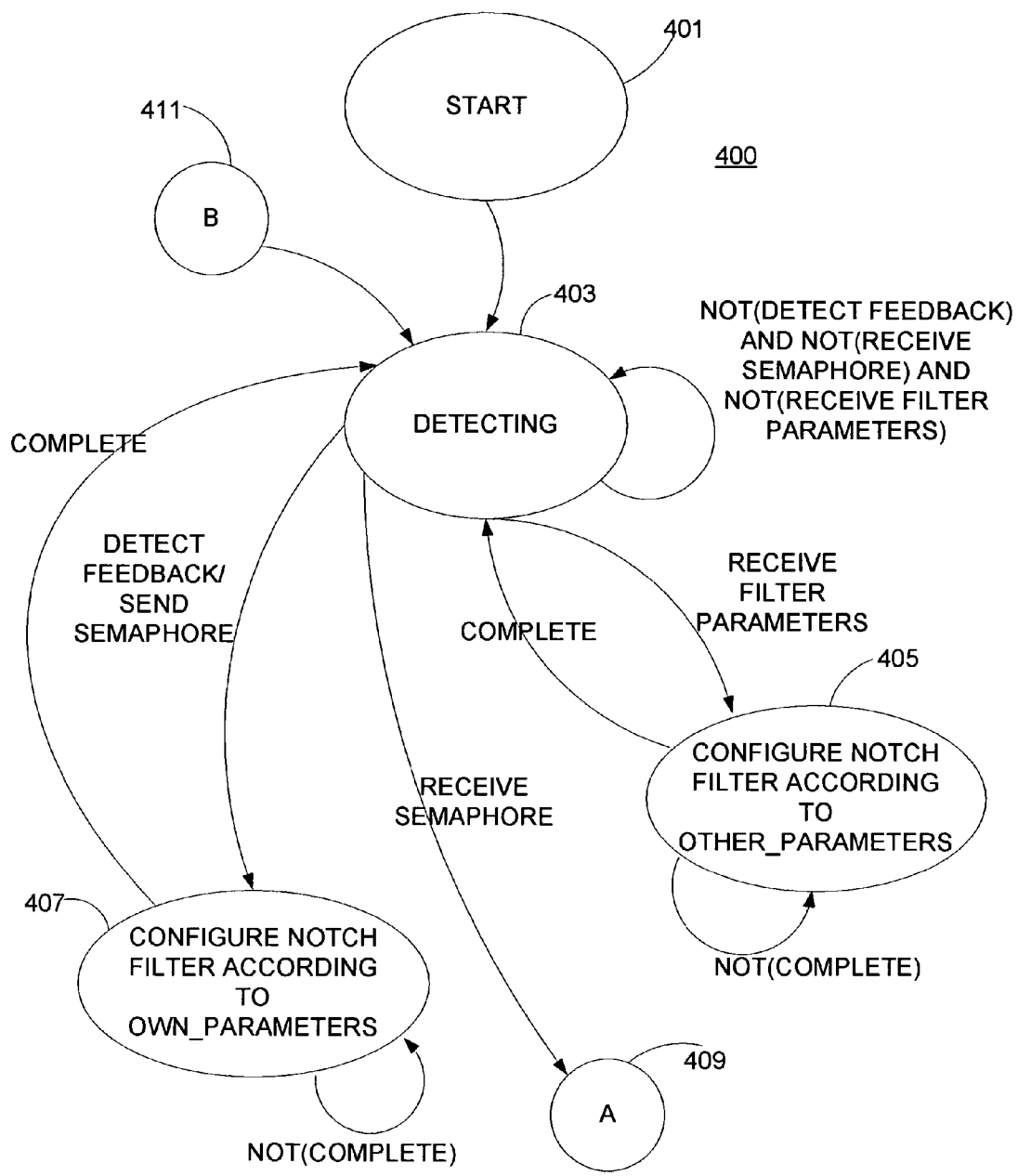
FIG. 4 shows a state diagram for a channel element of a multi-channel digital feedback reducer in accordance with an embodiment of the invention.
Figure 5:
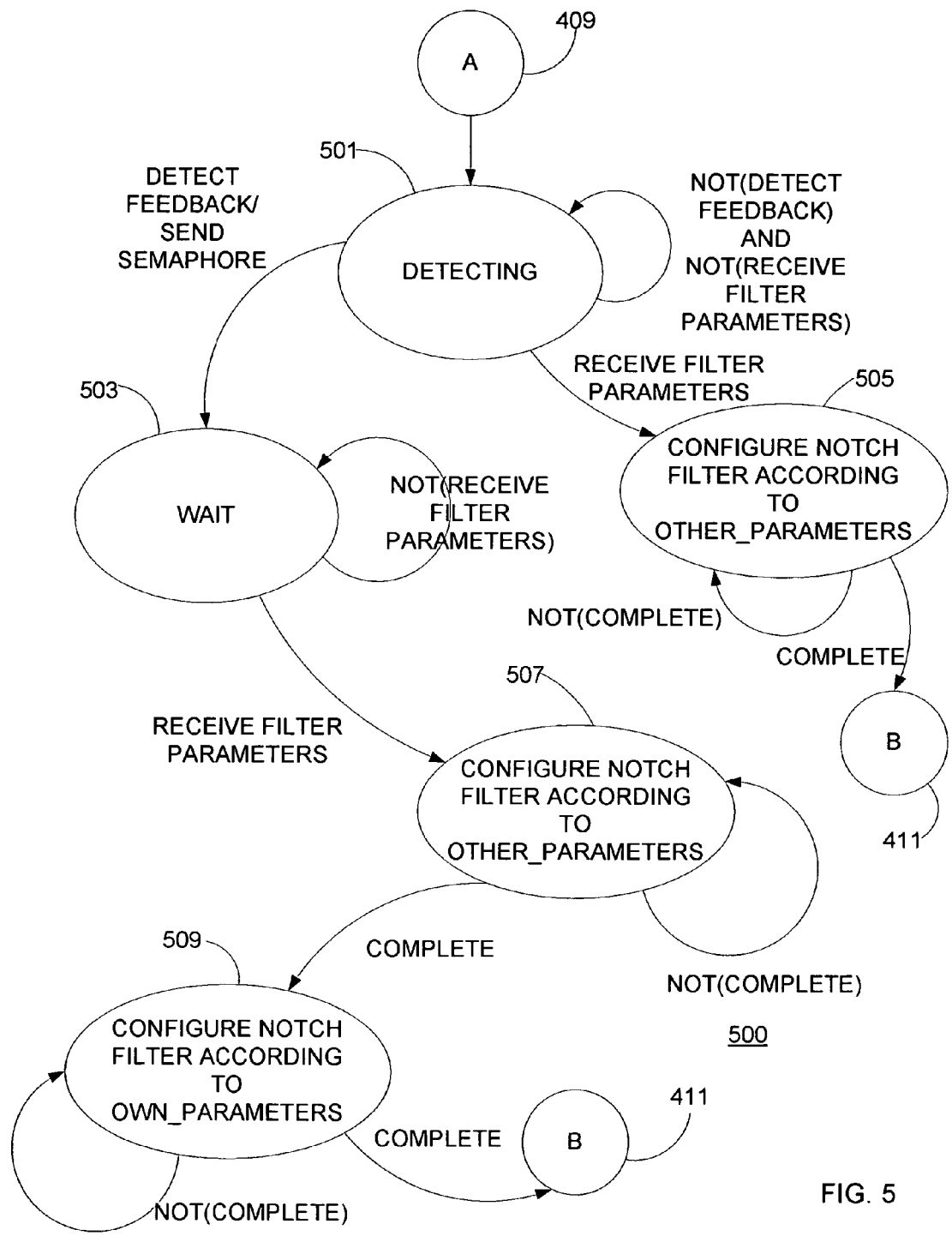
FIG. 5 is a state diagram that is a continuation of the state diagram that is shown in FIG. 4.

FIG. 4 shows a state diagram 400 for a channel element (e.g. left DFR 161 and right DFR 163 as shown in FIG. 1) of a multi-channel digital feedback reducer in accordance with an embodiment of the invention. As with DFR 161 and DFR 163, the channel element may comprise an operative notch filter and an adaptive notch filter. In the embodiment, each constituent channel element conforms to state diagram 400 and a state diagram 500 (that is shown in FIG. 5). In state 401, the channel element is initiated. For example, the constituent notch filters of the associated operative notch filters are reset so that any existing notches are removed. Consequently, the channel element transitions to state 403, in which the channel element searches for acoustic feedback on its associated channel. If the channel element detects acoustic feedback on its associated channel before another channel element detects acoustic feedback on its associated channel, in state 407 the channel element configures the associated operative notch filter in accordance with filter parameters that are determined from acoustic feedback detected on its channel. Once the filter configuration is completed, the channel element returns to state 403. While in state 403, if the channel element receives filter parameters from another channel element, the channel element configures its operative notch filter in accordance with the received filter parameters. The channel element returns to state 403 when the configuration of the operative notch filter is completed. (In FIGS. 4 and 5, the notation "NOT(A)" represents a negation of the statement "A".)

FIG. 5 is a state diagram that is a continuation of state diagram 400 that is shown in FIG. 4. If the channel element receives a semaphore (that indicates a detection of feedback on another channel) from another channel element while the channel element is in state 403, the channel element transitions to state 501, in which the channel element continues searching for feedback on its channel. However, in channel 501, if the channel element detects acoustic feedback, the channel element will not configure its associated operative notch filter until the channel element receives filter data from the other channel element that sent the semaphore. Consequently, as shown in state 503, the channel element waits for filter parameter information from the other channel element (that sent the previous semaphore) and sends a semaphore to the other channels elements. In state 507, the channel element receives filter parameters from the other channel element that previously sent a semaphore (as shown in transition 409 in FIG. 4), and configures the associated operative notch filter in state 507. When the configuration is completed, the channel element enters state 509, in which the associated operative notch filter is configured in accordance with filter parameters that are derived form the detected acoustic feedback on its channel. The channel element then returns to state 401 through transition 411.

If the channel element does detect acoustic feedback on its channel subsequent to receiving a semaphore from another channel element, the channel element enters state 505, in which the channel element configures the associated operative filter in accordance with filter parameters that are received from the other channel element and returns to state 403 through transition 411.

With the embodiment of the invention, interaction among the channel elements ensures that each channel element incorporates the same notch filters as the other channel elements. However, with other embodiments of the invention, varying spatial separation between channel elements of an N-channel DFR system may cause a varying acoustic correlation between different channel elements. In such a case, the channel elements may be grouped so that a channel element does not interact with all other channel elements but only with a subset of channel elements having a sufficiently high acoustic correlation. For example, channel elements that are the most spatially separated may not interact, while adjacent channel elements may interact in order to share filter information.

Figure 6:
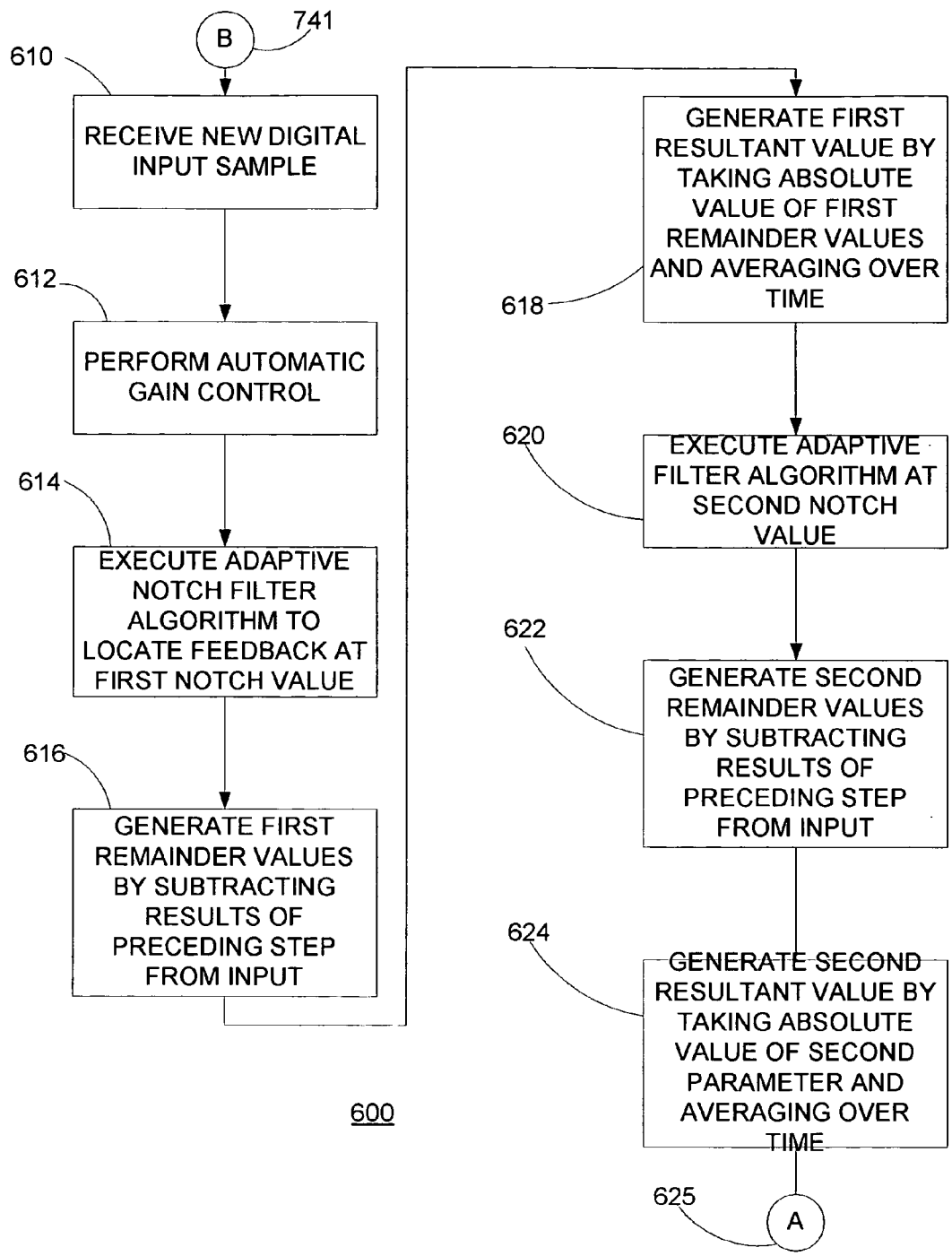
FIG. 6 is a flow diagram showing an algorithm for an adaptive notch filter that is utilized by an embodiment of the invention.

FIG. 6 is a flow diagram 600 showing an algorithm for an adaptive notch filter that is utilized by an embodiment of the invention. The algorithm is disclosed in U.S. Pat. No. 5,999,631 ("Acoustic Feedback Elimination Using Adaptive Notch Filter Algorithm"), which is incorporated by reference. Processor 105 (that executes a program corresponding to adaptive notch filters 125 and 127 as shown in FIG. 1) receives a new digital input sample from A/D converters 103 and 115 every 21 microseconds as shown in step 610. In step 612, processor 105 performs an automatic gain control function that includes a digital peak detector with a rapid attack and slow decay. The peak detector creates a control signal that keeps the value of the signals from A/D converters 103 and 115 normalized to the digital clipping level. This feature maintains a maximum undistorted signal for processing by an adaptive filter algorithm even in the presence of weak feedback signals.

Figure 8:
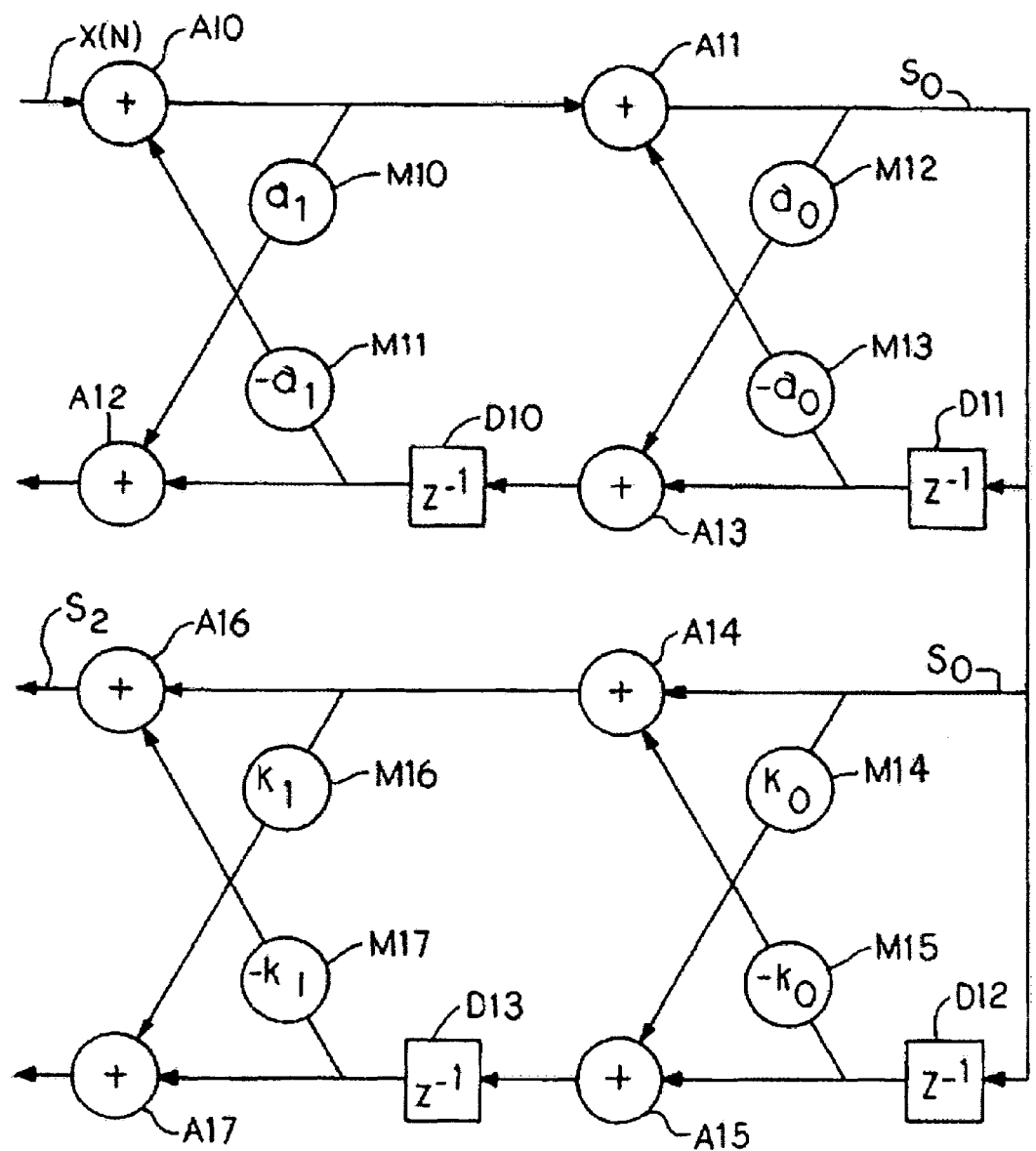
FIG. 8 shows a topology of an adaptive notch filter that is utilized by an embodiment of the invention.

The input sample values resulting from automatic gain control in step 612 (i.e., values $x(n)$) are operated on by an adaptive notch filter algorithm in step 614. FIG. 8 shows a topology of adaptive notch filters 125 and 127 that are utilized by an embodiment of the invention. FIG. 8 illustrates the adaptive notch filter algorithm in conventional filter notation. The algorithm includes addition terms A10-A17, multiplication terms M10-M17, and one clock cycle delays represented by D10-D13. During each clock cycle, a new value of $k_0$ is calculated and substituted in multiplication terms M14-M15. The value of $k_1$ is fixed at 1. In FIG. 8, $a_0=k_0$, $a_1=\alpha*k_1$, therefore $a_1=\alpha$.

The notch filter algorithm adapts parameter $k_0$ until the presence of acoustic feedback, if any, is detected. A value of $k$ is calculated according to the following equation:

$$k = \frac{-C(n+1)}{D(n+1)} \quad \text{(EQ. 1)}$$

from which $k_0(n)$ is calculated, where $k'_0(n)=(1-\gamma)k'_0(n-1)+\gamma k_0(n)$, $C(n+1)=\lambda C(n)+A(n+1)B(n+1)$, $D(n+1)=\lambda D(n)+A(n+1)A(n+1)$, $A(n+1)=2*s_0(n)$, $B(n+1)=s_0(n+1)+s_0(n-1)$, and $s_0(n+1)=x(n+1)-k_0(n)(1+\alpha)s_0(n)-\alpha*s_0(n-1)$, where $\alpha$ is a parameter that may range in value from 0.99 to 0.999 and corresponds to the phase angle bandwidth of the notch filter that may vary from 0.0375 to 0.075 degrees.

In step 614, the value of $k_0$ converges on a first value at which the values resulting from the notch filter algorithm described in FIG. 8 represent a minimum mean squared value over a time window. The time window is determined by the value of $\lambda$ which is set to a value less than one, such as 0.9. Stated differently, the value of parameter $k_0$ converges on a first notch value at which the value of $s_2^2$ is minimized over a time period determined by the value of $\lambda$ which preferably lies within the range 0.9 to 0.05. The algorithm illustrated in FIG. 8 results in a value $s_2$ at the end of step 614.

In step 616, value $s_2$ is used to generate first remainder values by subtracting the values of $s_2$ from the input values $x(n)$. In step 618, a first resultant value is calculated by taking the absolute value of the first remainder values and averaging them over time. Averaging is achieved by calculating the average of the absolute value signals using the following equation:

$$z(n)=\beta*y(n)+(1-\beta)*y(n-1)+(1-\beta)^2*y(n-2)+ \ldots +(1-\beta)^{10}*y(n-10)+ \quad \text{(EQ. 2)}$$

The term $\beta$ determines the averaging ratio, viz. the most recent sample is multiplied by the value of $\beta$ and the previous value of the average output is multiplied by a term $(1-\beta)$. This is the same concept as multiplying older values of $y$ by a smaller term. Values of $\beta$ are chosen for optimum performance and determine the value to which $z$ would average to for a given signal input.

In step 620, the value of $k_0$ for the algorithm illustrated in FIG. 8 is set to the relationship $-2k_0^2+1$, where the value of $k_0$ is the value obtained in step 614. If $k_0$ is represented by the $-\cos x$, then the new second value of $k_0$ is set equal to $\cos 2x$. With the new second value of $k_0$, the algorithm illustrated in FIG. 8 is again executed and the resulting output value $s_2$ is subtracted from the input $x(n)$ in step 622 to create second remainder values. In step 624, a second resultant value is calculated by taking the absolute value of the second remainder values and averaging them over time as in step 618.

Figure 7:
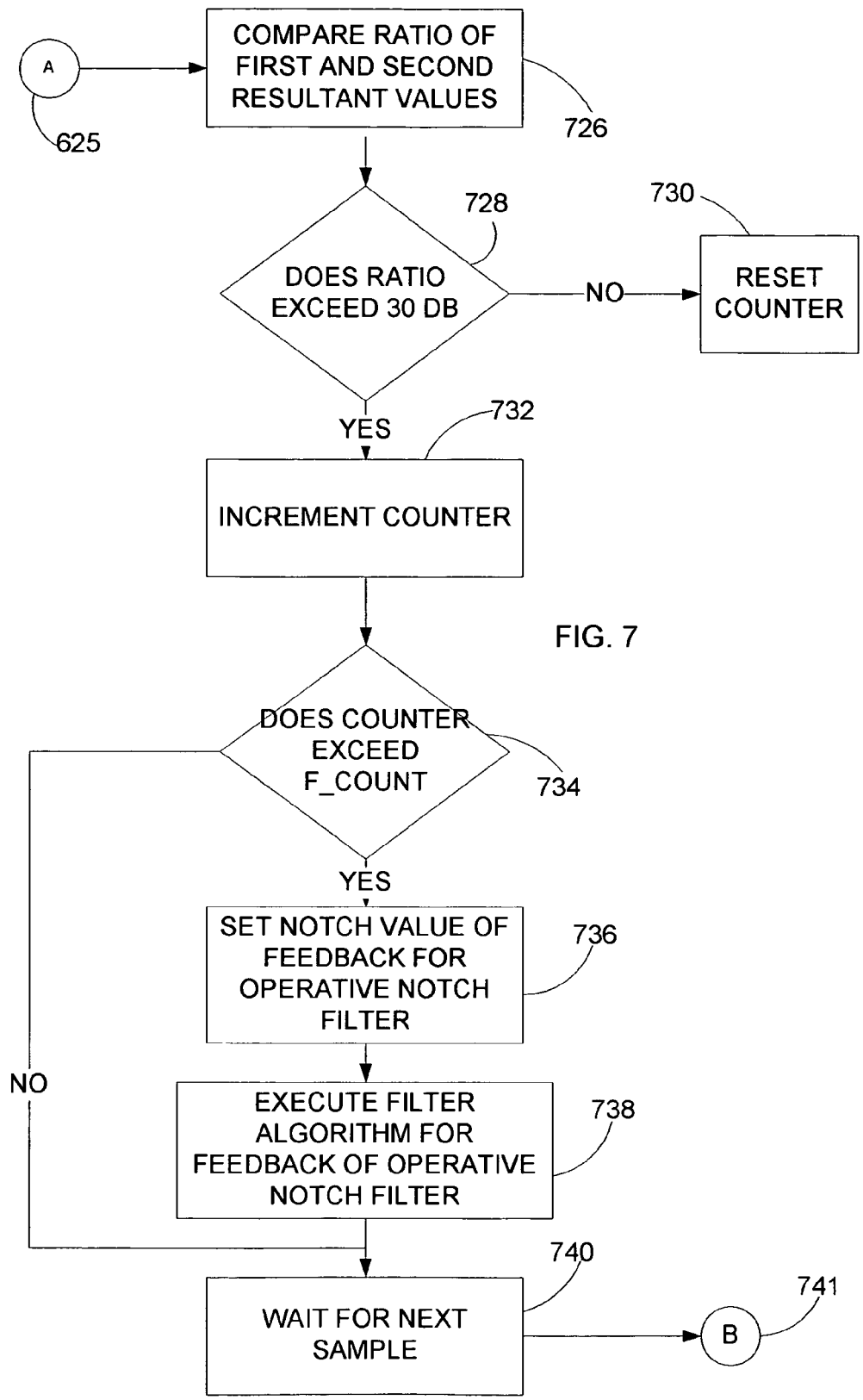
FIG. 7 is a continuation of the flow diagram that is shown in FIG. 6.

FIG. 7 is a continuation of flow diagram 600 that is shown in FIG. 6. In step 726, the ratio of the first and second resultant values obtained in steps 618 and 624 are calculated (referring to FIG. 6). In step 728, if the ratio exceeds 30 decibels, a software counter is incremented in step 732. If the ratio does not exceed 30 decibels, then the software counter is reset in step 730. In steps 734 and 736, the algorithm determines whether the software counter exceeds a predetermined threshold count (F_COUNT as shown in FIG. 7). The count corresponds to a time period preferably lying in the range of 50 to 100 milliseconds. If the count is exceeded, then the notch value $k_0$ of the filter algorithm shown in FIG. 8 is set to the same value obtained in step 614. In step 738, the filter algorithm shown in FIG. 8 is executed with the value of $k_0$ obtained from step 614. Step 738 results in a substantial decrease in the magnitude of the feedback signal detected in steps 610-734. Step 738 is executed as many times as necessary with $k_0$ set to different values corresponding to feedback detected in steps 610-734 at different values of $k_0$.

The output digital signals resulting from step 738 are sent to a digital to analog converter (107 or 117 as shown in FIG. 1). In step 740, the algorithm waits for the next sample and returns via path 741 to step 610 (as shown in FIG. 6) in order to execute another cycle of the algorithm.

The flow diagrams shown in FIGS. 6 and 7 should be construed in the context of a parallel topology that is shown in FIG. 1. As shown in FIG. 1, an adaptive notch filter (e.g.

adaptive filter 125) and an operative notch filter (e.g. operative notch filter 123) of a channel element (e.g. DFR element 161) process an acoustic signal in a parallel fashion. However, other embodiments of the invention may support other channel element topologies.

Figure 9:
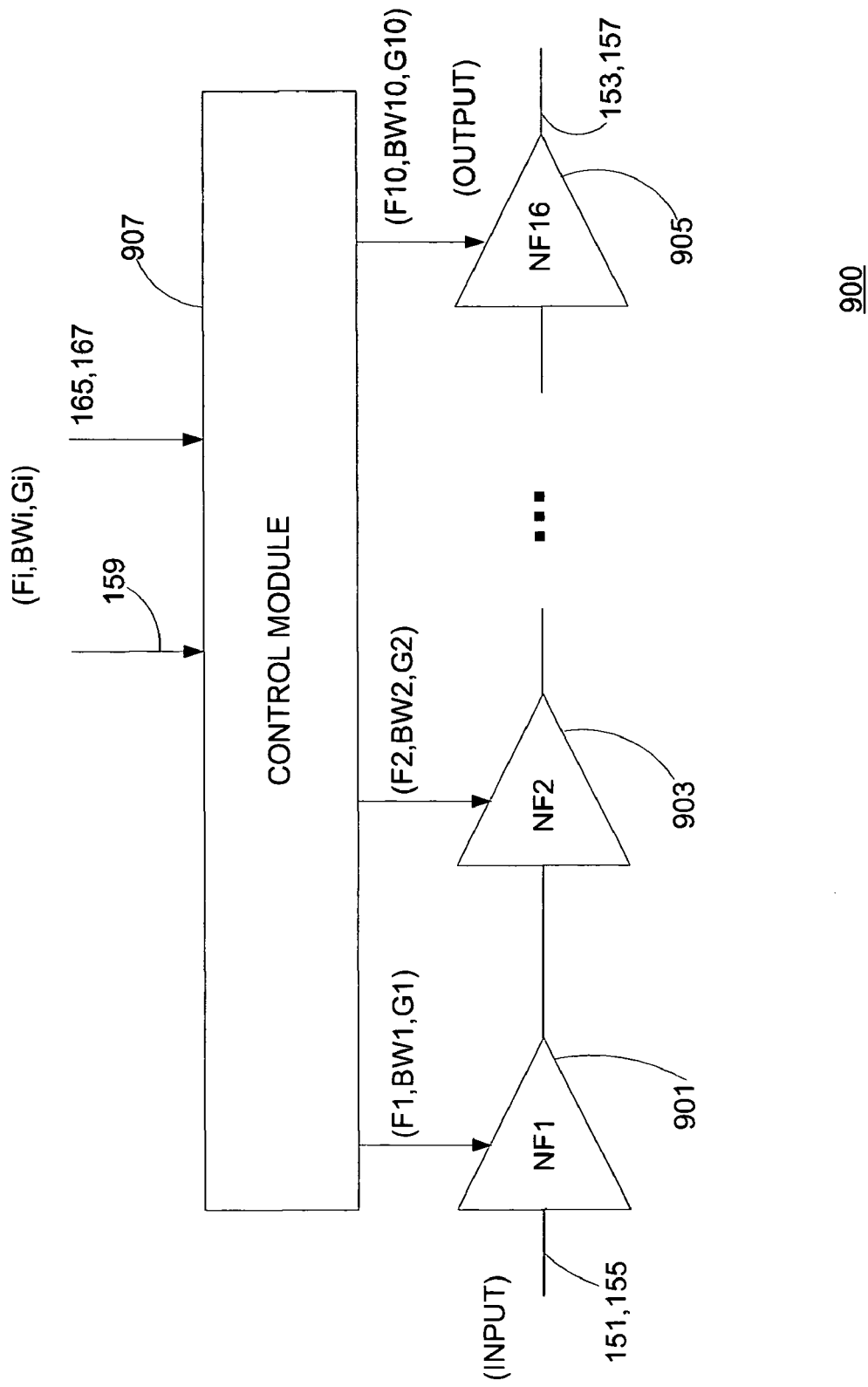
FIG. 9 shows a functional architecture of an operative notch filter that is utilized by an embodiment of the invention.

FIG. 9 shows a functional architecture of an operative notch filter 900 (which correspond to operative filters 123 and 129 as shown in FIG. 1) that is utilized by an embodiment of the invention. In the embodiment, operative notch filter 900 comprises sixteen constituent notch filters NF1 901, NF2 903, NF3-NF15 (not shown), and NF16 905. (The exemplary embodiment supports 16 notch filters; however, variations of the embodiment may support a different number of notch filters.) Operative notch filter 900 has a serial topology, although other embodiments may utilize other topologies such as a parallel topology. Other embodiments may utilize a different number of constituent notch filters that may be greater than or less than ten. Each consistent notch filter (e.g. NF1 901) receives filter parameters (e.g. $F_1$, $BW_1$, and $G_1$ corresponding to NF1 901) from a control module 907. Control module 907 receives filter parameters $F_i$, $BW_i$, and $G_i$ through communications path 159, control path 165, or control path 167 (as shown in FIG. 1). Control module 907 stores the filter parameters for the active constituent notch filters. (If a constituent notch filter is not active, the corresponding notch filter is not configured for a notch.) Operative notch filter 900 inputs an input signal at input 151 or 155 and outputs a processed signal at output 151 or 157.

FIG. 10 shows exemplary performance data 1000 of a dual-channel digital feedback reducer. The exemplary performance data corresponds to three trials 1003, 1005, and 1007, in which acoustic feedback (corresponding to frequency 1001) is induced. With exemplary performance data 1000, response times are measured in which a notch of 18 dB is configured. In trials 1003, 1005, and 1007, the associated response times for a stereophonic DFR configuration is faster than that for a mono DFR configuration. In fact, with performance data 1000, the average response time for a stereophonic DFR is approximately 0.5 seconds faster than the average response time for a mono DFR.

The embodiment of the invention, as shown in state diagrams 400 and 500, may utilize different notch filter configurations. The notch filters shown in FIGS. 1, 8 and 9 illustrate exemplary embodiments.

As can be appreciated by one skilled in the art, a computer system with an associated computer-readable medium containing instructions for controlling the computer system can be utilized to implement the exemplary embodiments that are disclosed herein. The computer system may include at least one computer such as a microprocessor, digital signal processor, and associated peripheral electronic circuitry.

I claim:

1. A multi-channel acoustic system comprising:
a first channel element that detects a first acoustic feedback component of a first acoustic signal and that processes the first acoustic signal from a first performance microphone to ameliorate the first acoustic feedback component, the first acoustic feedback component corresponding to a first feedback path from at least one speaker to the first performance microphone, the first performance microphone and an associated acoustic source of the first performance microphone being located on a same performance stage;
a second channel element that detects a second acoustic feedback component of a second acoustic signal from a second performance microphone and that processes the second acoustic signal to ameliorate the second acoustic feedback component, the second acoustic feedback component corresponding to a second feedback path from the at least one speaker to the second performance microphone, the second performance microphone and a corresponding acoustic source of the second performance microphone being located on the same performance stage; and
a communications pathway between the first channel element and the second channel element, wherein one of the channel elements informs another channel element about detecting acoustic feedback by providing determined filter parameters, wherein the determined filter parameters characterize the acoustic feedback, and wherein the other channel element may continue searching for an associated acoustic feedback component while said one of the channel elements configures in accordance with the determined filter parameters.

2. The multi-channel acoustic system of claim 1, wherein the first channel element and the second channel element are functionally identical.

3. The multi-channel acoustic system of claim 1, wherein the first channel element comprises:
a first adaptive notch filter that detects the first acoustic feedback component; and
a first operative notch filter that attenuates the first acoustic feedback component as instructed by the first adaptive notch filter or the second channel element.

4. The multi-channel acoustic system of claim 3, wherein the second channel element comprises:
a second adaptive notch filter that detects the second acoustic feedback component; and
a second operative notch filter that attenuates the second acoustic feedback component as instructed by the second adaptive notch filter or the first channel element.

5. The multi-channel acoustic system of claim 4, wherein the second operative notch filter receives filter parameters from the first operative notch filter in response to the first adaptive notch filter detecting the first acoustic feedback component.

6. The multi-channel acoustic system of claim 4, further comprising:
an additional channel element that detects an additional acoustic feedback component of an additional acoustic signal, the additional channel element comprising an additional operative notch filter.

7. The multi-channel acoustic system of claim 6, wherein the first channel element sends filter parameters to the second channel element and the additional channel element through the communications pathway, and wherein configurations of the first operative notch filter, the second operative notch filter, and the additional operative notch filter are interactive with each other.

8. The multi-channel acoustic system of claim 6, wherein the first channel element sends filter parameters to the second channel element and not to the additional channel element through the communications pathway, wherein the first operative notch filter and the second operative notch filter are interactive, and wherein the first operative notch filter and the other operative notch filter are not interactive.

9. The multi-channel acoustic system of claim 4, wherein:
(a) the first adaptive notch filter configures the first operative notch filter when the first adaptive notch filter has detected the first acoustic feedback component and when the second adaptive notch filter is not deploying the second operative notch filter;

(b) the first operative notch filter notifies the second operative filter that the first acoustic feedback component has been detected; and (c) the second acoustic adaptive filter continues to search for the second acoustic feedback component.

10. The multi-channel acoustic system of claim 4, wherein:

(a) the first adaptive notch filter defers configures the first operative notch filter when the first adaptive notch filter has detected the first acoustic feedback component and when the second adaptive notch filter is deploying the second operative notch filter;

(b) the first acoustic adaptive filter continues to search for the first acoustic feedback component while the first operative notch filter waits for the determined filter parameters from the second operative notch filter; and (c) the first operative notch filter configures in accordance with the determined filter parameters when the first operative notch filter receives the determined filter parameters from the second operative notch filter.

11. The multi-channel acoustic system of claim 3, wherein the first operative notch filter comprises:

a control module that receives filter parameters from the second channel element or from the first adaptive notch filter; and at least one constituent notch filter comprising a first constituent notch filter, wherein the first constituent notch filter is characterized by a first notch frequency and a first notch depth, and wherein the first notch frequency and the first notch depth are configured by the control module in accordance with the filter parameters.

12. The multi-channel acoustic system of claim 1, wherein the second channel element receives filter parameters from the first channel element in response to the first channel element detecting the first acoustic feedback component.

13. The multi-channel acoustic system of claim 1, further comprising:

an additional channel element that detects an additional acoustic feedback component of an additional acoustic signal.

14. A method for ameliorating acoustic feedback in a multi-channel acoustic system, the multi-channel acoustic system comprising a first channel element and a second channel element, the first channel element being associated with a first acoustic channel and the second channel element being associated with a second acoustic channel, the method comprising:

(a) detecting, by the first channel element, a first acoustic feedback component, wherein the first acoustic feedback component corresponds to a first feedback path from at least one speaker to a first performance microphone, an acoustic source of the first performance microphone and the first performance microphone being located on a same performance stage;

(b) sending, by the first channel element, a first indicator that is indicative of the first acoustic feedback component to the second channel element;

(c) determining a first set of filter parameters;

(d) sending the first set of filter parameters to the second channel element, wherein the first set of filter parameters characterize the acoustic feedback;

(e) adjusting the first channel element to ameliorate the first acoustic feedback component in accordance with the first set of filter parameters and to generate an acoustic signal with reduced feedback from the at least one speaker.

15. The method of claim 14, further comprising:

(f) receiving, by the second channel element, the first indicator from the first channel element;

(g) searching, by the second channel element, for a second acoustic feedback component;

(h) receiving, by the second channel element, the first set of filter parameters; and (i) adjusting the second channel element in accordance with the first set of filter parameters.

16. The method of claim 15, further comprising:

(j) detecting, by the second channel element, the second acoustic feedback component;

(k) determining, by the second channel element, a second set of filter parameters;

(l) adjusting the second channel element to ameliorate the second acoustic feedback component in accordance with the second set of filter components.

17. The method of claim 16, further comprising:

(m) in response to (j), sending, by the second channel element, a second indicator that is indicative of the second acoustic feedback component to the first channel element.

18. The method of claim 16, further comprising:

(m) in response to (l), sending, by the second channel element, the second set of filter parameters to the first channel element.

19. The method of claim 16, further comprising:

(m) in response to (j), sending, by the second channel element, a second indicator that is indicative of the second acoustic feedback component to the first channel element; and (n) in response to (m), sending, by the second channel element, the second set of filter parameters to the first channel element.

20. The method of claim 14, wherein (c) comprises:

(i) determining a notch frequency; and (ii) selecting a notch depth.

21. The method of claim 20, wherein (ii) comprises:

(1) increasing the notch depth by an incremental amount.

22. The method of claim 21, wherein (1) further comprises:

(2) repeating (1) until the notch depth reaches a predetermined maximum value.

23. The method of claim 21, wherein (1) further comprises:

(2) repeating (1) until the first acoustic feedback component is ameliorated.

24. The method of claim 14, further comprising:

(f) receiving, by the second channel element, the first indicator from the first channel element;

(g) determining that a predetermined time has elapsed while waiting for the first set of filter parameters from the first channel element; and (h) in response to (g), executing a corrective action.

25. A computer-readable medium having stored computer-executable instructions for performing:

(a) detecting, by the first channel element, a first acoustic feedback component, wherein the first acoustic feedback component corresponds to a first feedback path from at least one speaker to a first performance microphone, an acoustic source of the first performance microphone and the first performance microphone being located on a same performance stage;

(b) sending, by the first channel element, a first indicator that is indicative of the first acoustic feedback component to the second channel element;
(c) determining a first set of filter parameters;
(d) sending the first set of filter parameters to the second channel element, wherein the first set of filter parameters characterize the acoustic feedback;
(e) adjusting the first channel element to ameliorate the first acoustic feedback component in accordance with the first set of filter parameters.

26. The computer-readable medium of claim 25 having stored computer-executable instructions for further performing:
(f) receiving, by the second channel element, the first indicator from the first channel element;
(g) searching, by the second channel element, for a second acoustic feedback component;
(h) receiving, by the second channel element, the first set of filter parameters; and
(i) adjusting the second channel element in accordance with the first set of filter parameters.

27. The computer-readable medium of claim 26 having stored computer-executable instructions for further performing:
(j) detecting, by the second channel element, the second acoustic feedback component;
(k) determining, by the second channel element, a second set of filter parameters;
(l) adjusting the second channel element to ameliorate the second acoustic feedback component in accordance with the second set of filter components.

* * * * *